(12) United States Patent
Jung

(10) Patent No.: US 6,335,899 B1
(45) Date of Patent: Jan. 1, 2002

(54) COMPENSATION CAPACITANCE FOR MINIMIZING BIT LINE COUPLING IN MULTIPORT MEMORY

(75) Inventor: Chang Ho Jung, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/552,266

(22) Filed: Apr. 19, 2000

(51) Int. Cl.[7] ................................................ G11C 7/00
(52) U.S. Cl. .................. 365/230.05; 365/205; 365/206; 365/214; 365/217
(58) Field of Search ........................ 365/189.01, 230.01, 365/230.05, 205, 204, 207, 206, 214, 217

(56) References Cited

U.S. PATENT DOCUMENTS

| | | | | | |
|---|---|---|---|---|---|
| 5,400,275 A | * | 3/1995 | Abe et al. | .................... | 365/145 |
| 5,677,867 A | * | 10/1997 | Hazani | .................. | 365/185.01 |
| 5,886,943 A | * | 3/1999 | Sekiguchi et al. | ..... | 365/230.03 |
| 5,903,033 A | * | 5/1999 | Suwa | ......................... | 257/358 |
| 6,104,653 A | * | 8/2000 | Proebsting | .................. | 365/203 |
| 6,163,475 A | * | 12/2000 | Proebsting | .................... | 365/63 |

FOREIGN PATENT DOCUMENTS

| | | | | |
|---|---|---|---|---|
| JP | 363133394 A | * | 6/1988 | |
| JP | 409232531 A | * | 9/1997 | |

* cited by examiner

Primary Examiner—Viet Q. Nguyen

(57) ABSTRACT

A compensation capacitance is utilized in a multiport memory device to compensate for the effect of bit line coupling capacitance. A first compensation capacitance is applied between a read bit line and a write bar bit line, and a second compensation capacitance is applied between a write bit line and a read bar bit line to compensate for the effect of bit line capacitance that adversely affects the differential voltage swing at a the read bit line. In one embodiment, the compensation capacitances are equal to the value of the compensation capacitances. In an alternative embodiment, each compensation capacitance comprises two compensation capacitors additively combined in parallel each having a value of one-half of the coupling capacitance. The compensation capacitance may be variable so that compensation of the coupling capacitance may be optimized after fabrication of the integrated circuit.

19 Claims, 5 Drawing Sheets

COMPENSATION CAPACITANCE FOR MINIMIZING BIT LINE COUPLING IN MULTIPORT MEMORY

BACKGROUND

The present invention is directed generally to memory devices, and more specifically to compensating for the effects of bit line coupling capacitance in two port memory devices.

Coupling capacitance between bit lines in memory devices can be sufficiently large to interfere with memory operations. Where the coupling capacitance is sufficiently large, data sense operations are delayed until enough bit line difference occurs for a read operation. Without any compensation for coupling capacitance, performance of the memory device is degraded due to the coupling capacitance. Prior systems typically implemented a twisted bit line configuration to reduce the coupling capacitance between bit lines in higher density bit line core designs. However, twisted bit line techniques are difficult to apply to multiport memory devices such as static random access memory (SRAM). For most memory devices, each bit line has a coupling effect on an adjacent bit line voltage swing. The coupling effect will cause the memory device to malfunction, or will reduce the performance of the device. Twisted bit line techniques have been applied to single port memories. Even when the bit lines are twisted as in single port memory, read and write data still have coupling capacitance issues, that is the coupling effect has merely been traded from being between a read line and a read line to being between a read line and a write line. For multiport memory, it is difficult to implement a twisted bit line scheme. Furthermore, implementing a twisted bit line approach to coupling capacitance requires extra area to accommodate the twists, and extra logic is still required in a twisted bit line scheme that also requires extra chip area. Therefore, a need exists to compensate for bit line coupling capacitance in multiport memory devices.

SUMMARY

The present invention compensates for the effect of bit line coupling capacitance in multiport memory by providing compensation capacitance to reduce or eliminate the effect bit line coupling capacitance without requiring a twisted bit line scheme or extra logic circuits. In one embodiment, a compensation capacitance is added between read and write bar bit lines, and a compensation capacitance is added between write and read bar bit lines to compensate for the coupling capacitances between read and write bit lines and between write bar and read bar bit lines. The compensation capacitance may be added in a peripheral area at the perimeter of the core memory area of a semiconductor substrate, or may be incorporated within the core memory area itself.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiment of the invention, an example of which is illustrated in the accompanying drawings.

Figure 1:
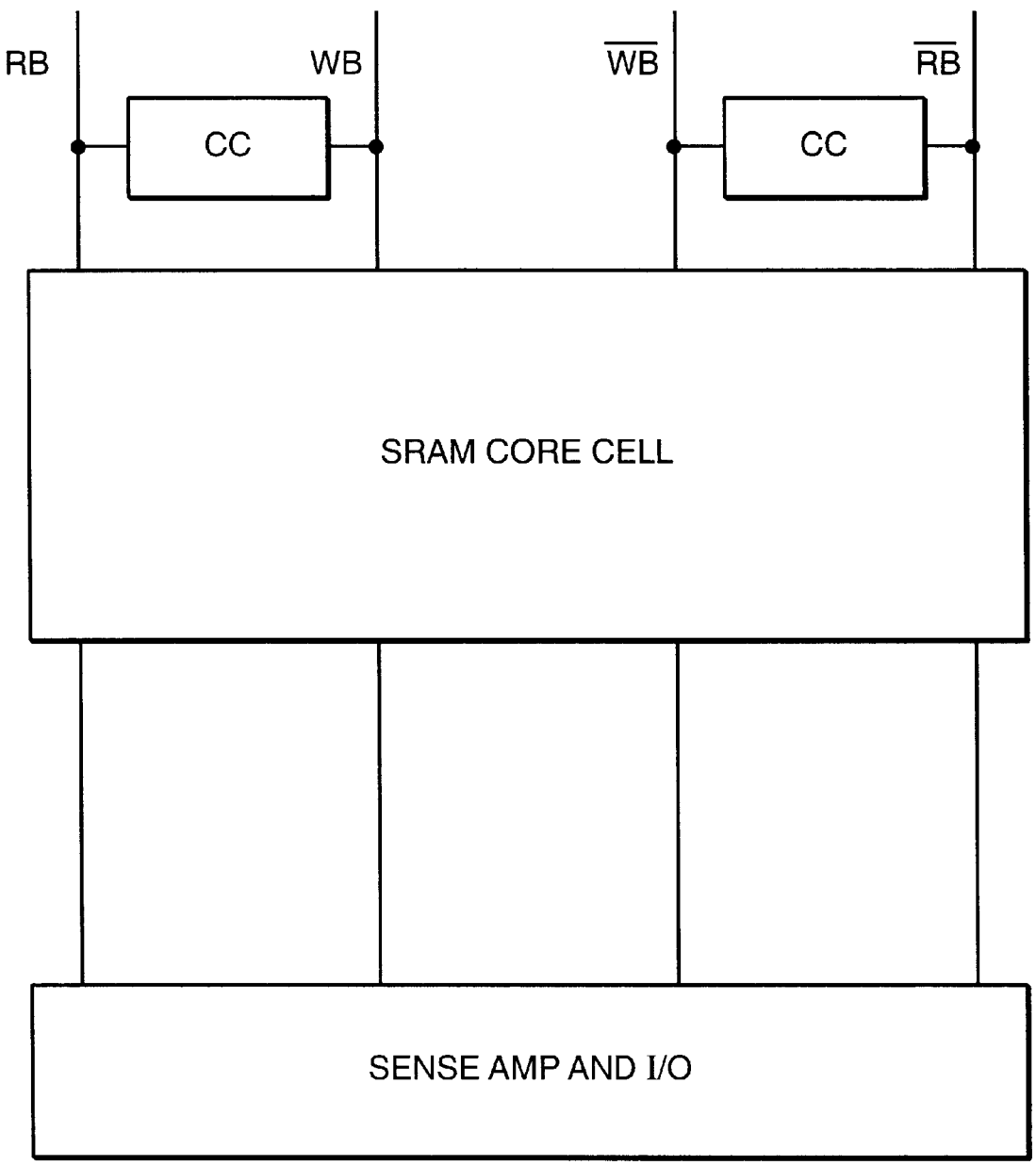
FIG. 1 is a block diagram of an SRAM two-port memory cell showing coupling capacitance between adjacent bit lines.

Referring now to FIG. 1, a block diagram of a multiport memory cell having coupling capacitance between bit lines for which the present invention compensates will be discussed. As shown in FIG. 1, for all memory devices, each bit line has a coupling effect upon the bit line voltage swing with an adjacent bit line. The coupling effect will cause a malfunction of the device, or degrade its performance. Bit line coupling capacitance will usually be approximately one-twentieth of the bit line capacitance. However, even such a small ratio coupling capacitance is capable of adversely affecting the bit line voltage difference because the voltage difference is on the order of a 100 mV range for bit line sensing. FIG. 1 shows a block diagram of a multiport core memory cell, which is a two-port SRAM cell in the example shown. Core cell 110 includes a read bit line (RB) 110, a write bit line (WB) 112, a write bit bar line (WB bar) 116, and a read bit bar line (RB bar) 118. Respective bit lines 112, 114, 116, and 118 pass through core cell 110 and couple with sense amplifier and input/output (I/O) circuit block 120. A coupling capacitance (CC) 122 exists between adjacent bit lines 112 and 114, and another coupling capacitance (CC) 124 exists between adjacent bit lines 116 and 119. The resulting coupling capacitances are due to the physical configuration and spacing of the bit lines, and although the coupling capacitances are represented as a single lumped element for example purposes, actual coupling capacitance is distributed along the length of the bit lines. In addition, a coupling capacitance may exist between any two adjacent bit lines such as 114 and 116, however the coupling capacitance 122 between read and write bit lines 112 and 114, and coupling capacitance 124 between write bit bar and read bit bar lines 116 and 118 tend to have a greater effect upon the operation of core cell 110 and thus are of interest in compensating for their effect.

A more adverse scenario of the effect of bit line coupling capacitance is during a read operation on one port while a write operation occurs on the other port at the same column. For performance, area, and power issues read bit line 112 will undergo a smaller voltage difference, but write bit line 114 will undergo a full voltage swing (e.g., one VDD), and it will affect the voltage on read bit line 112 through coupling capacitance 122. If no coupling capacitance existed, each bit line voltage will swing to provide a sufficient differential voltage detectable by sense amp & I/O 120. However, the bit line coupling effect causes the voltage swing on the read bit line to be smaller, less than a threshold level that sense amp & I/O 120 is capable of immediately detecting. Without compensation for coupling capacitance 122, sensing time needs to be delayed until the voltage swing at bit line 112 has reached the threshold level of sense amp & I/O 120, thereby degrading the performance of core memory cell 120.

Figure 2:
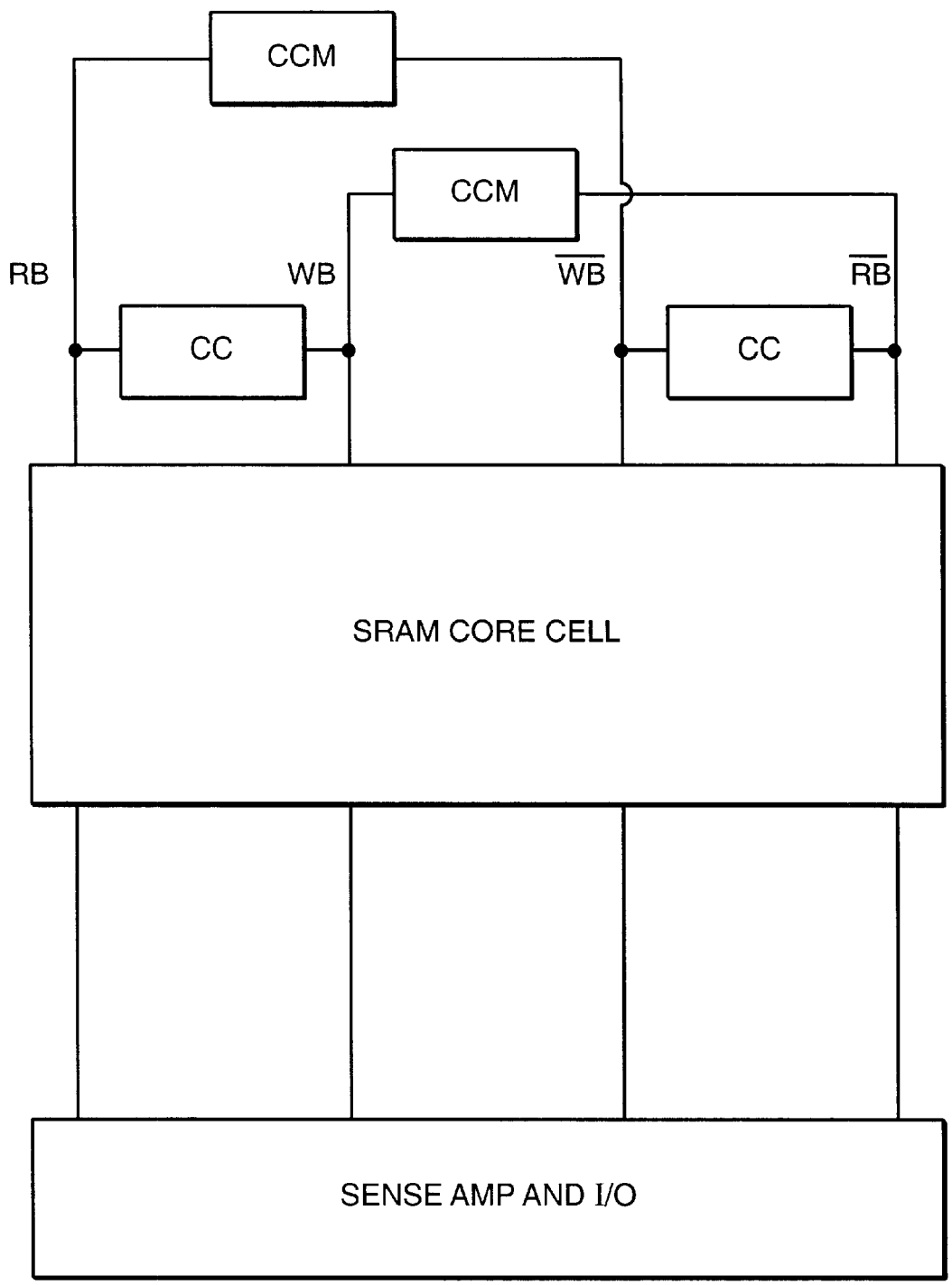
FIG. 2 is a block diagram of the two-port memory cell of FIG. 1 showing one embodiment of the utilization of compensation capacitors to compensate for the effects of coupling capacitance in accordance with the present invention.

Referring now to FIG. 2, a block diagram of a multiport memory device utilizing compensation capacitance to compensate for the effect of bit line coupling capacitance in accordance with the present invention will be discussed. A first compensation capacitance (CCM) 126 is provided between read bit line 112 and write bit bar line 116, and a second compensation capacitance (CCM) 128 is provided between write bit line 114 and read bit bar line 118 in order to compensate for the adverse effects of coupling capacitances 122 and 124. The values of compensation capacitances 126 and 128 in one embodiment as shown in FIG. 2 are approximately the same values of coupling capacitances 122 and 124. The application of compensation capacitances 126 and 128 will compensate for the increased voltage swings appearing on bit lines 112 and 116 due to coupling capacitances 122 and 124 so that the decrease in voltage swing due to coupling capacitances 122 and 124 is increased to a level sufficient for threshold sensing by sense amp & I/O 120, that is the voltage degradation to one bit line by coupling capacitance 122 will be approximately the same as the degradation to the other bit line due to compensation capacitance 126. In one typical embodiment of the invention, coupling capacitance 122 will have a value of C, and the bit line capacitance between bit lines 112 and 116 will have a value of 20C. By adding compensation capacitance 126 having a value of C, the net value of the bit line capacitance and compensation capacitance 126 is 21C. The increased net bit line capacitance does not affect bit line sensing by sense amp & I/O 120 when compared to the cross coupling effect of coupling capacitance 122. However, added compensation capacitance 126 will compensate for, reduce, or eliminate the effect of coupling capacitance 122.

Figure 3:
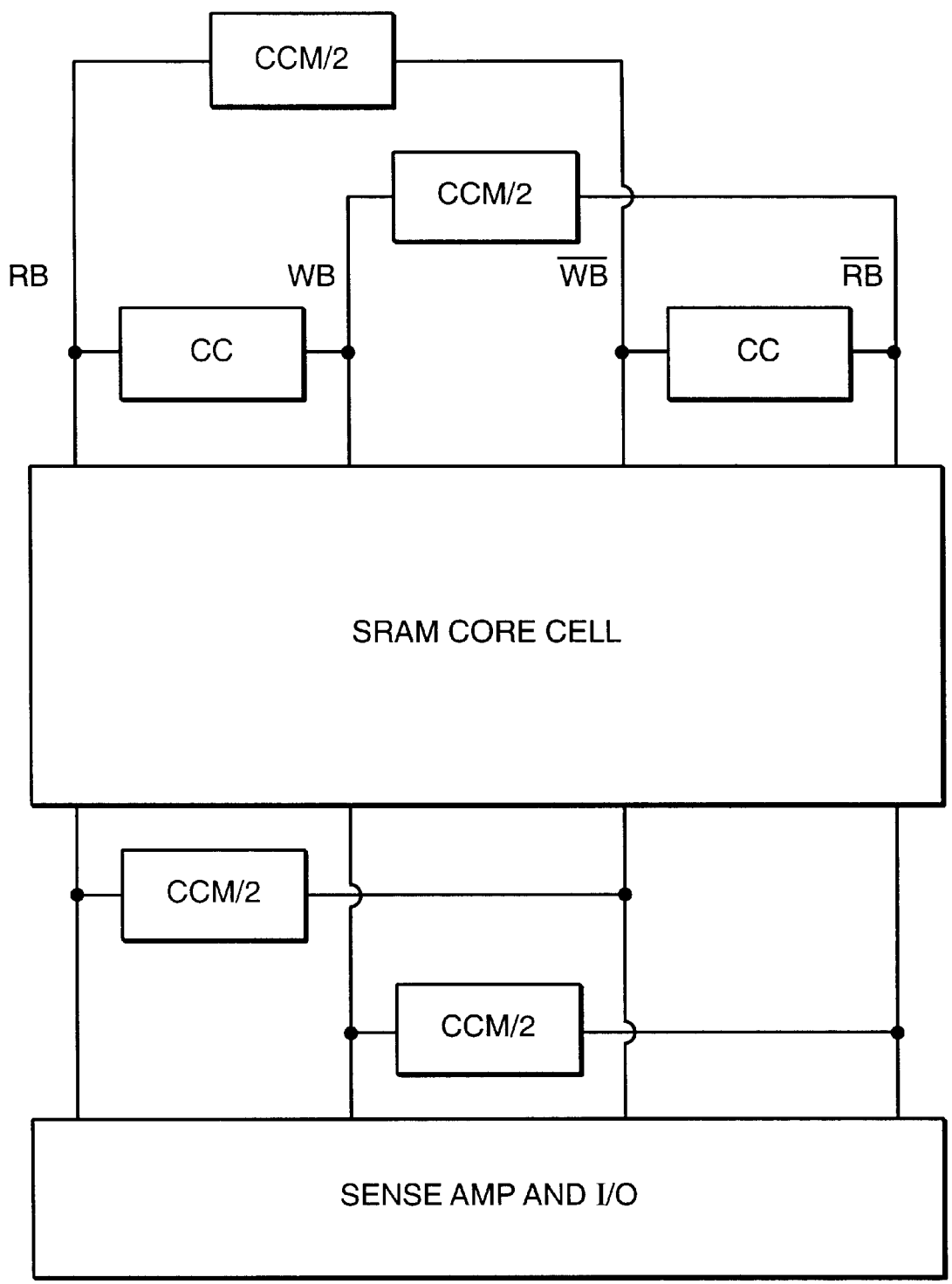
FIG. 3 is a block diagram of the two-port memory cell of FIG. 1 showing another embodiment of the utilization of compensation capacitors to compensate for the effects of coupling capacitance in accordance with the present invention.
Figure 4:
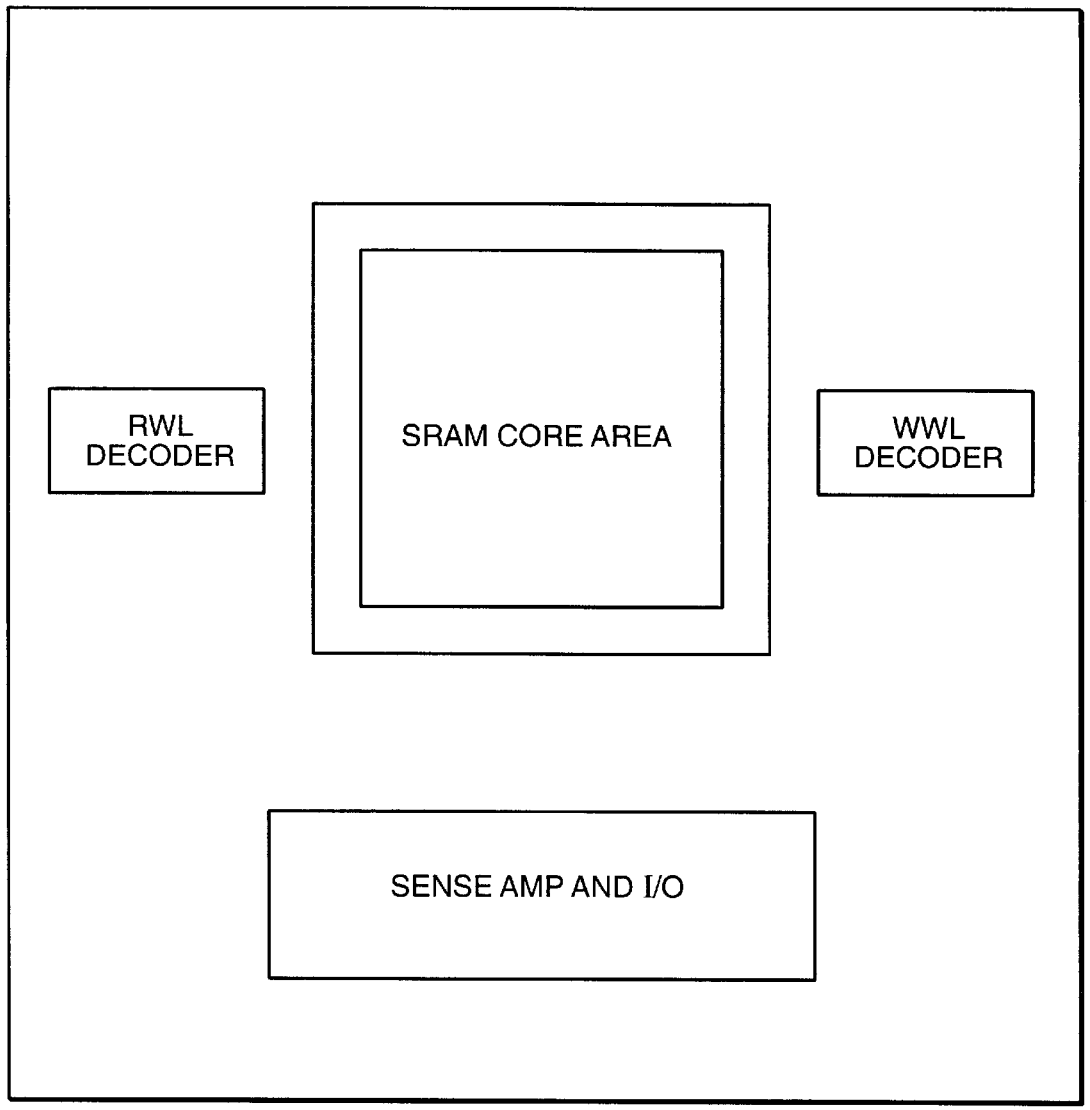
FIG. 4 is a block diagram of a semiconductor substrate on which a two-port memory is disposed utilizing compensation capacitance in accordance with the present invention.

Referring now to FIG. 3, block diagram an alternative embodiment of a multiport memory device utilizing compensation capacitance to compensate for the effect of bit line coupling capacitance in accordance with the present invention will be discussed. The operation of the embodiment of the invention shown in FIG. 3 is substantially the same as that of the embodiment of the invention shown in FIG. 2, however, instead of providing a single compensation capacitance 126 between two bit lines 112 and 116, the compensation capacitance is divided among multiple compensation capacitances. In the example shown in FIG. 2, the compensation capacitance between bit lines 112 and 116 is distributed among two capacitances (CCM/2) 130 and 134 each having a value approximately equal to one-half of the value of coupling capacitance 122. Since compensation capacitances 130 and 134 are configured in parallel between bit lines 112 and 114, the capacitance values are additive, and present an effective total compensation capacitance approximately equal to the value of coupling capacitance 122. Likewise, two compensation capacitors 132 and 136 are disposed between bit lines 116 and 118 each having a value of approximately one-half of coupling capacitance 124 so that the total effective capacitance provided by compensation capacitances 132 and 136 is approximately equal to coupling capacitance 124. As shown in the embodiment of FIG. 4, a first compensation capacitance 130 is disposed on a first side of core cell 110, and a second corresponding compensation capacitance 134 is disposed on a second side of core cell 110. It is conceived that other configuration embodiments of compensation capacitance may be provided without departing from the scope or spirit of the invention and without providing substantial change thereto. For example, although coupling capacitances 126, 128, 130, 132, 134, and 136 are shown as being disposed exterior to core cell 110, it is conceived that in an alternative embodiment, one or more or all of coupling capacitances 126, 128, 130, 132, 134, and 136 could be disposed within the internal area of core cell 110. Furthermore, although the embodiment of FIG. 3 shows two coupling capacitances 130 and 132 each configured in parallel with the other and each having a value of approximately one-half of coupling capacitance 122 for which coupling capacitances 130 and 132 are intended to compensate, other numbers of capacitances in other configurations may be utilized to achieve the same result as the disclosed embodiments as would be apparent to one of skill in the art after having been apprised of the present invention. Additionally, the values of compensation capacitances 126, 128, 130, 132, 134, and 136 may be configured as having programmable values so that a designer may select an optimum capacitance value after fabrication of the semiconductor chip on which the memory device is implemented to optimally match each actually coupling capacitance resulting after fabrication of the memory chip. It should be noted that exact matching of compensation capacitances 126, 128, 130, 132, 134, and 136 to coupling capacitances 122 and 144 is not required; it is sufficient that compensation capacitances 126, 128, 130, 132, 134, and 136 compensate for the effect of coupling capacitances 122 and 124 so that the bit line voltage swing is sufficient to be detected by sense amp & I/O 120 sooner than without utilization of compensation capacitances 126, 128, 130, 132, 134, or 136. It should be further noted that although an SRAM memory device is shown, the present invention may be utilized in any multiport memory device where bit line coupling capacitance potentially is capable of degrading the performance of the memory device such that the present invention is not limited to SRAM devices.

Referring now to FIG. 4, a semiconductor substrate having a multiport memory device utilizing compensation capacitance in accordance with the present invention will be discussed. The multiport memory device 410 is implemented as an integrated circuit on semiconductor substrate 410, or chip. The memory cell circuits are disposed within core area 412. Compensation capacitances 126, 128, 130, 132, 134, and 136 may be disposed in a peripheral area 414 about the perimeter of core area 412. As shown in FIG. 4, core area 412 and peripheral area 414 are disposed between read word line decoder 416, write word line decoder 418, and sense amp and I/O 120 circuits. The utilization of compensation capacitance in peripheral area 414 does not require a significant amount of additional area of substrate 410 so that compensation capacitance may be readily implemented on existing semiconductor substrates without requiring changing the layout of semiconductor substrate 410.

Figure 5:
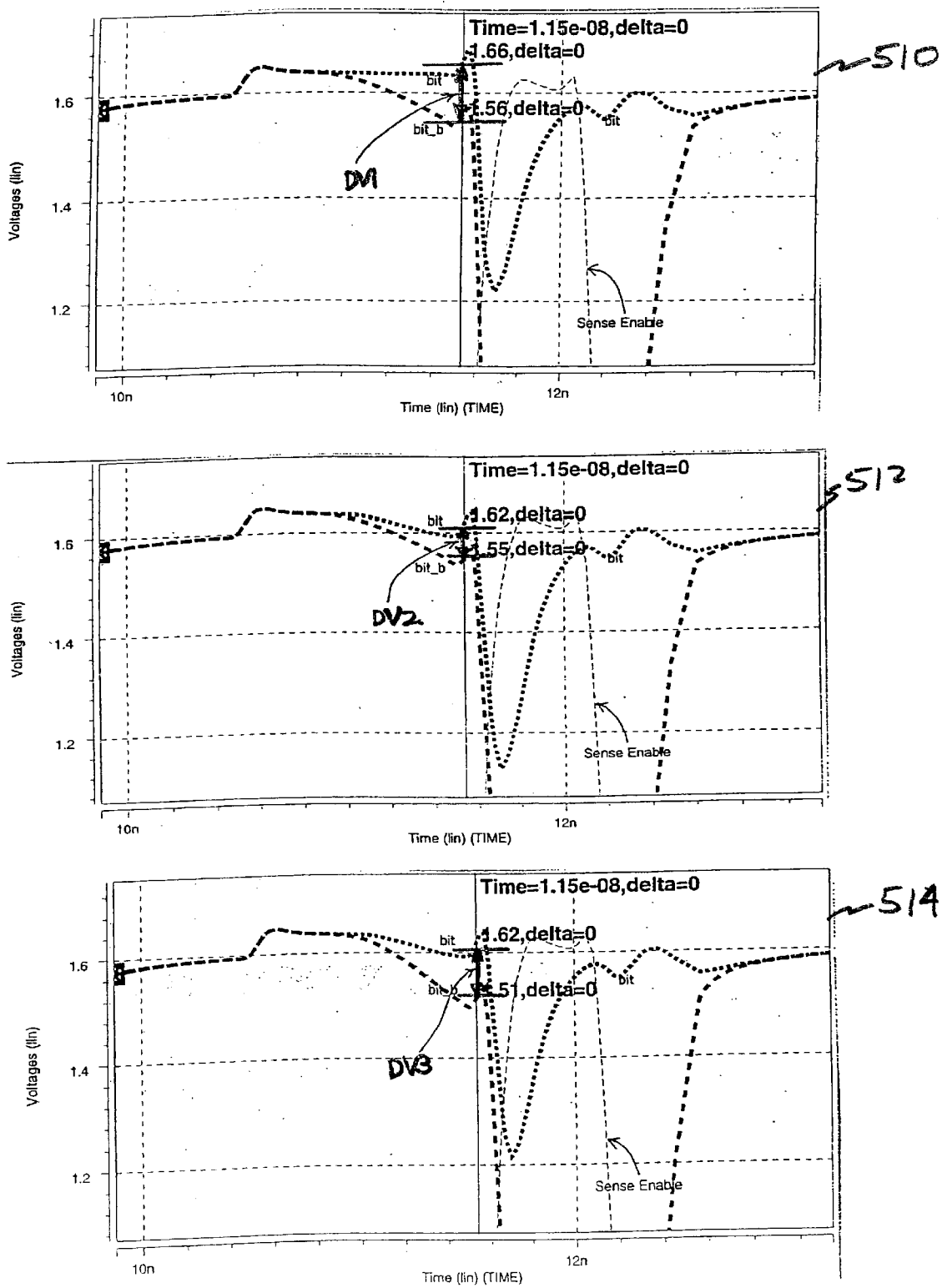
FIG. 5 shows plots of the bit line differential voltage swing illustrating the compensation of the bit line coupling effect in accordance with the present invention.

Referring now to FIG. 5, voltage plots of the bit line voltage in a multiport memory device showing the effect and compensation of bit line coupling capacitance in accordance with the present invention will be discussed. In plot 510, DV1 represents the read bit line 112 differential voltage swing without the effects of coupling capacitance 122. As shown in plot 510, the value of differential voltage DV1 is sufficiently large to be detected by sense amp & I/O 120. In plot 512, DV2 represents the read bit line 112 differential voltage swing when the effect of coupling capacitance 122 is considered. As shown in plot 512, the value of DV2 is less than the value of DV1 in plot 510. The value of DV2 is decreased over the value of DV1 due to the effect of coupling capacitance 122, which results in degraded performance of the memory device. In plot 514, DV3 represents the read bit line 112 differential voltage swing which includes the effect of coupling capacitance 122 and which further includes compensation of the coupling capacitance effect with compensation capacitor 126. As shown in plot 510, the value of DV3 is greater than the value of DV2 such that the value of DV2 is sufficiently large to be sensed by sense amp & I/O 120. Thus, utilization of compensation capacitances 126, 128, 130, 132, 134, and 136 in accordance with the present invention provides compensation for the effect of coupling capacitances 122 and 124 in multiport memory.

It is believed that the compensation capacitance for minimizing bit line coupling in multiport memory of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:
   a core memory cell having a read bit line, a write bit line, a write bar bit line, and a read bar bit line, wherein a coupling capacitance is disposed between said read bit line and said write bit line; and
   first means disposed between said read bit line and said write bar bit line and second means disposed between said write bit line and said read bar bit line, said first and second means for compensating for an effect of the coupling capacitance so that a differential voltage swing at said read bit line may be detected during a read operation.

2. An apparatus as claimed in claim 1, said compensating means being a compensation capacitance having a value approximately equal to a value of the coupling capacitance.

3. An apparatus as claimed in claim 1, at least one of said first and second compensating means comprising a first compensation capacitor disposed on a first side of said core memory cell, and a second compensation capacitor disposed on a second side of said core memory cell, said first and second compensation capacitors being coupled in parallel and each having a value approximately one-half of a value of the coupling capacitance.

4. An apparatus as claimed in claim 1, said first and second compensating means including a compensation capacitor disposed within said core memory cell.

5. An apparatus as claimed in claim 1, said core memory cell being a multiport memory device.

6. An apparatus as claimed in claim 1, said core memory cell being an SRAM memory device.

7. An apparatus as claimed in claim 1 at least one of said first and second compensating means comprising a variable capacitance capable of being adjusted to an optimum value.

8. A method, comprising:
   providing a core memory cell having a read bit line, a write bit line, a write bar bit line, and a read bar bit line, wherein a coupling capacitance is disposed between said read bit line and said write bit line; and
   providing a first compensation capacitance disposed between said read bit line and said write bar bit line and a second compensation capacitance disposed between said write bit line and said read bar bit line, said first and second compensation capacitances for compensating for an effect of the coupling capacitance so that a differential voltage swing at said read bit line may be detected during a read operation.

9. A method as claimed in claim 8, the first and second compensation capacitances each having a value approximately equal to a value of the compensation capacitance.

10. A method as claimed in claim 8, at least one of said first and second compensating capacitances comprising a first compensation capacitor disposed on a first side of said core memory cell, and a second compensation capacitor disposed on a second side of said core memory cell, said first and second compensation capacitors being coupled in parallel and each having a value approximately one-half of a value of the coupling capacitance.

11. A method as claimed in claim 8, the core memory cell being a multiport memory device.

12. A method as claimed in claim 8, the core memory cell being an SRAM memory device.

13. A method as claimed in claim 8, at least one of said first and second compensation capacitances being a variable capacitance.

14. An article of manufacture, comprising:
   a semiconductor substrate;
   a core memory area disposed on said semiconductor substrate;
   a peripheral area disposed about a perimeter of said core memory area;
   a compensation capacitance formed within said peripheral area, said compensation capacitance for compensating for an effect of a coupling capacitance between bit lines of said core memory area.

15. An article of manufacture as claimed in claim 14, said compensation capacitance being formed at least in part within said core memory area.

16. An article of manufacture as claimed in claim 14, said core memory area including a multiport memory device.

17. An article of manufacture as claimed in claim 14, said core memory area including an SRAM memory device.

18. An article of manufacture as claimed in claim 14, said compensation capacitance being a variable capacitance.

19. An article of manufacture as claimed in claim 14, further comprising a sense amp and I/O, the compensation capacitance not being physically located between said core memory area and said sense amp and I/O.

* * * * *